United States Patent
Chen et al.

(10) Patent No.: US 9,164,545 B2
(45) Date of Patent: Oct. 20, 2015

(54) COVER WITH ANGLE ADJUSTABLE STANDING SLOT

(71) Applicant: Wistron Corporation, New Taipei (TW)

(72) Inventors: Chien-Wei Chen, New Taipei (TW); Cheng-Hsing Liu, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 127 days.

(21) Appl. No.: 14/203,716

(22) Filed: Mar. 11, 2014

(65) Prior Publication Data

US 2015/0198975 A1 Jul. 16, 2015

(30) Foreign Application Priority Data

Jan. 15, 2014 (TW) ................... 103101436

(51) Int. Cl.
G06F 1/16 (2006.01)
H05K 5/00 (2006.01)
H05K 5/03 (2006.01)
H05K 5/02 (2006.01)

(52) U.S. Cl.
CPC ............ *G06F 1/1632* (2013.01); *H05K 5/0086* (2013.01); *H05K 5/0226* (2013.01); *H05K 5/0239* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 6,560,103 B1 * | 5/2003 | Dohi | ...................... | G06F 1/1632 361/679.43 |
| 7,782,608 B2 * | 8/2010 | Lee | ...................... | G06F 1/1632 361/679.41 |
| 8,867,203 B2 * | 10/2014 | Katsuta | ............... | E05B 73/0082 361/679.01 |
| 2004/0190234 A1 * | 9/2004 | Lin | ......................... | G06F 1/162 361/679.28 |
| 2008/0055843 A1 * | 3/2008 | Ke | ......................... | G06F 1/1656 361/679.43 |
| 2011/0141685 A1 * | 6/2011 | Hung | ..................... | G06F 1/1632 361/679.43 |
| 2011/0194233 A1 * | 8/2011 | Ahn | ....................... | G06F 1/1624 361/679.01 |
| 2011/0194268 A1 * | 8/2011 | Kim | ..................... | H04M 1/0227 361/807 |
| 2012/0287562 A1 * | 11/2012 | Wu | ....................... | G06F 1/1626 361/679.01 |
| 2012/0293938 A1 * | 11/2012 | Dai | ....................... | G06F 1/1622 361/679.07 |
| 2013/0170126 A1 * | 7/2013 | Lee | ....................... | G06F 1/1654 361/679.17 |
| 2013/0170131 A1 * | 7/2013 | Yen | ....................... | G06F 1/1632 361/679.44 |
| 2013/0188304 A1 * | 7/2013 | Lee | ....................... | G06F 1/1667 361/679.12 |

* cited by examiner

*Primary Examiner* — Hoa C Nguyen
*Assistant Examiner* — Xanthia C Cunningham
(74) *Attorney, Agent, or Firm* — McClure, Qualey & Rodack, LLP

(57) ABSTRACT

A cover with an angle adjustable standing slot is used to place an electronic device. The cover includes a keyboard, a cradle with a standing slot, a torque structure, and an elastic structure. The electronic device can be placed to the standing slot. A user can push the electronic device to rotate the cradle and the cradle would force the torque structure and the elastic structure to move. The electronic device can be stopped at an appropriate viewing angle, because the force between the electronic device, the torque structure, and the elastic structure are balanced. Additionally, the user can use the keyboard on the cover to type or edit documents anytime and anywhere.

10 Claims, 8 Drawing Sheets

COVER WITH ANGLE ADJUSTABLE STANDING SLOT

CROSS-REFERENCES TO RELATED APPLICATIONS

This non-provisional application claims priority under 35 U.S.C. §119(a) on Patent Application No. 103101436 filed in Taiwan, R.O.C. on 2014 Jan. 15, the entire contents of which are hereby incorporated by reference.

BACKGROUND

1. Technical Field

The disclosure relates to a protecting cover, and particularly to a cover with angle adjustable standing slot applicable to a handheld electronic device in which the tilting angle between the cover and the electronic device is adjustable upon the electronic device is assembled on the cover.

2. Related Art

In addition to being interfaces for browsing webpages, for some people tablet PCs are also provided for editing documents. However, in contrast with a physical keyboard, inputting a great deal of information through a virtual keyboard provided on the tablet PC is slower and inconvenient, requiring a physical keyboard connected with the tablet PC being developed, in order to improve significantly the convenience with which a great deal of information must be inputted into the tablet PC. Currently, a cover with physical keyboard assembled is commercially available, so that the cover protects the tablet PC as long as carrying the physical keyboard, and a user can use the physical keyboard on the cover to type or edit documents anytime and anywhere.

However, the angle between the conventional cover with physical keyboard and the tablet PC is fixed. That is, when the tablet PC is connected or assembled on the fastening structure of the conventional cover, the angle between the conventional cover and the tablet PC cannot be adjusted. Consequently, since the user cannot adjust the angle between the cover and the tablet PC according to their viewing angle, they must change their postures to operate or watch the tablet PC; however, improper postures result in health complaints after extended use.

SUMMARY

In view of this, the disclosure provides a cover with angle adjustable standing slot used to place an electronic device. The cover includes a base, a cradle, at least one driven member, at least one torque structure and at least one elastic structure. The base has a receiving groove. The cradle is rotatably assembled on the base and rotatable between an initial position and an adjusted position. The at least one driven member is assembled in the receiving groove and connected to the cradle. The at least one torque structure is also assembled in the receiving groove and connected to the at least one driven member. The at least one elastic structure is assembled in the receiving groove as well and connected to the at least one driven member.

When the electronic device is placed in the cradle with an outer force being applied to the electronic device so as to drive the cradle to rotate from the initial position to the adjusted position, the cradle pushes the at least one driven member to drive the at least one torque structure and the at least one elastic structure. Meanwhile, since the force balance is formed among the at least one torque structure, the at least one elastic structure and the electronic device, the cradle is secured at the adjusted position when the contact force is removed.

As described previously, since the electronic device is secured at the required angle by the force balancing among the torque structure, the elastic structure and the electronic device, the required angle is adjustable according to user requirements within an interval. Additionally, since the angle adjustment is achieved by means of force balancing rather than means of engaging structure, the required angle can be adjusted slightly rather than being fixed at a preset angle. Again, since the angle adjustment is achieved by means of force balancing, when the user detaches the electronic device from the cradle, the elastic force of the elastic structure drives the cradle to move resiliently.

The detailed features and advantages of the disclosure are described below in great detail through the following embodiments, the content of the detailed description is sufficient for those skilled in the art to understand the technical content of the disclosure and to implement the disclosure there accordingly. Based on the content of the specification, the claims, and the drawings, those skilled in the art can easily understand the relevant objectives and advantages of the disclosure.

BRIEF DESCRIPTION OF THE DRAWINGS

The disclosure will become more fully understood from the detailed description given herein below for illustration only and thus not limitative of the disclosure, wherein.

DETAILED DESCRIPTION

Figure 1:
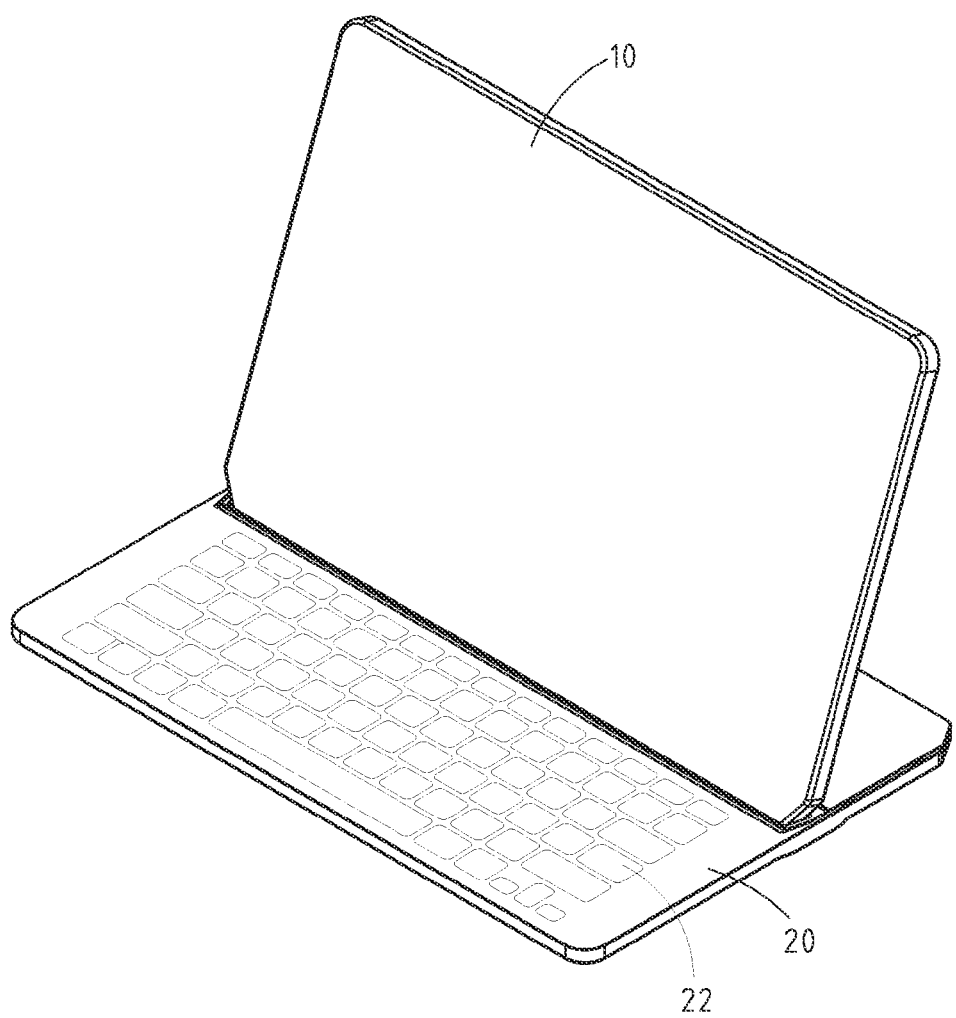
FIG. 1 is a perspective view of a cover with angle adjustable standing slot of a first embodiment of the disclosure.
Figure 2:
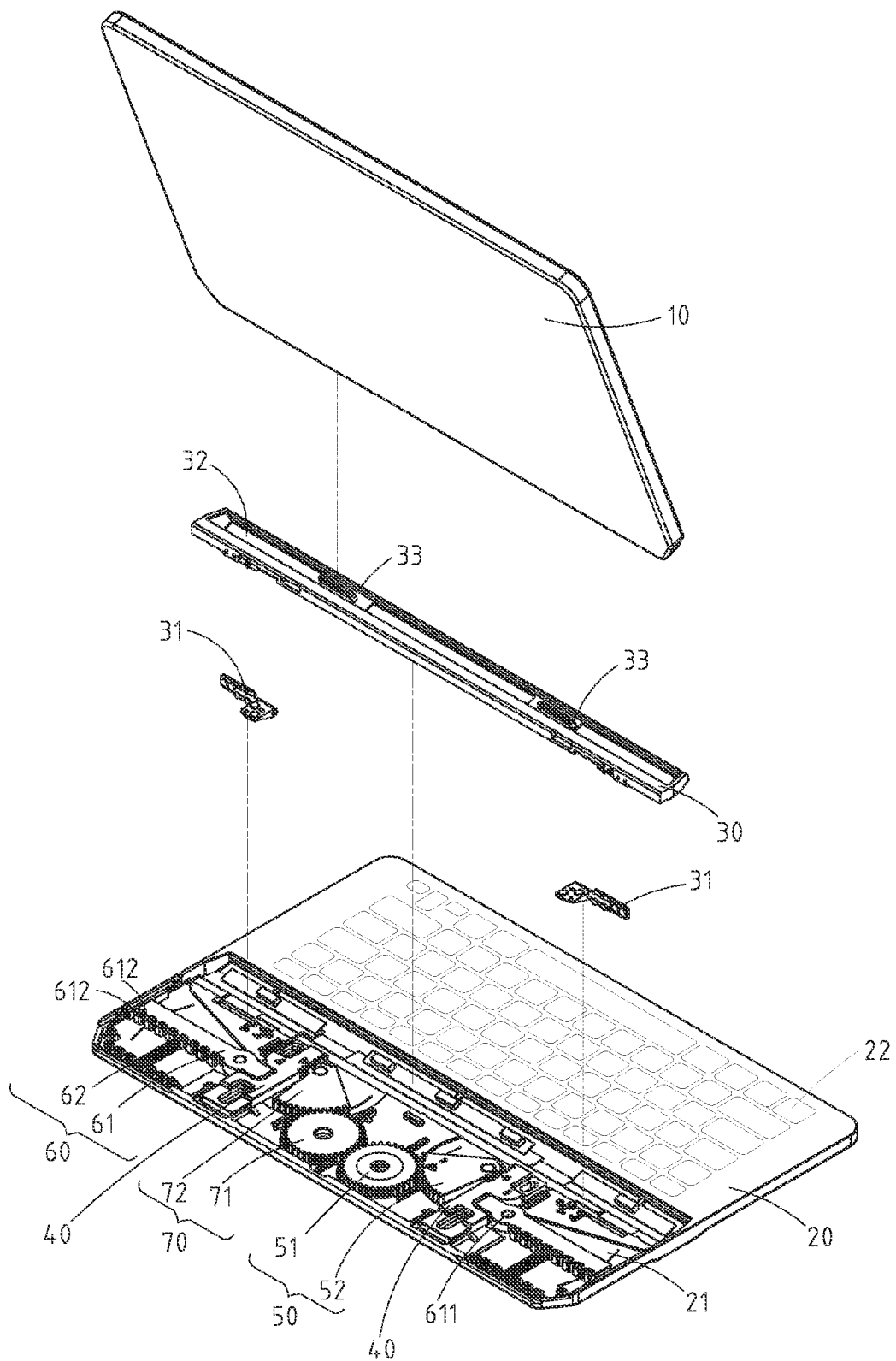
FIG. 2 is an exploded view of the cover with angle adjustable standing slot of the first embodiment of the disclosure.

Please refer to FIG. 1 and FIG. 2, which are respectively a perspective view and an exploded view of a cover with angle adjustable standing slot of a first embodiment of the disclosure. The cover with angle adjustable standing slot can be used to place an electronic device 10. The cover includes a base 20, a cradle 30, two driven members 40, a torque structure 50 and two elastic structures 60. The electronic device 10 can be a tablet PC, a cell phone or other handheld electronic apparatuses. The base 20 has a receiving groove 21 and a keyboard 22. The two driven members 40, the torque structure 50 and the two elastic structures 60 are assembled in the receiving groove 21. The cradle 30 is rotatably assembled on the base 20 and rotatable between an initial position and an adjusted position. The number of the driven members 40 and that of the elastic structures 60 can be one or more than one; in this embodiment, two driven members 40 and two elastic structures 60 are applied.

As shown in FIG. 2, the cradle 30 is pivotally assembled on the base 20 via the two pivoting shafts 31, so that the cradle 30 is rotatable using the two pivoting shafts 31 as rotating axis. As shown in FIG. 1, when a user tends to stand up and tilt the electronic device 10 for watching or inputting information, the user assembles the electronic device 10 in the cradle 30, so that the electronic device 10 is disposed in the initial position. In order to assemble the electronic device 10 in the cradle 30, the cradle 30 has a standing slot 32 recessed therein, so that the electronic device 10 is engaged in the standing slot 32. In order to enhance the engagement between the electronic device 10 and the standing slot 32, two protruding blocks 33 are extrudingly disposed in the standing slot 32, and two recessed portions (not shown), corresponding to the two protruding blocks 33 are disposed on the electronic device 10 respectively, so that the electronic device 10 does not detach from the standing slot 32 when the user touches or tabs the touch panel of the electronic device 10.

Figure 3:
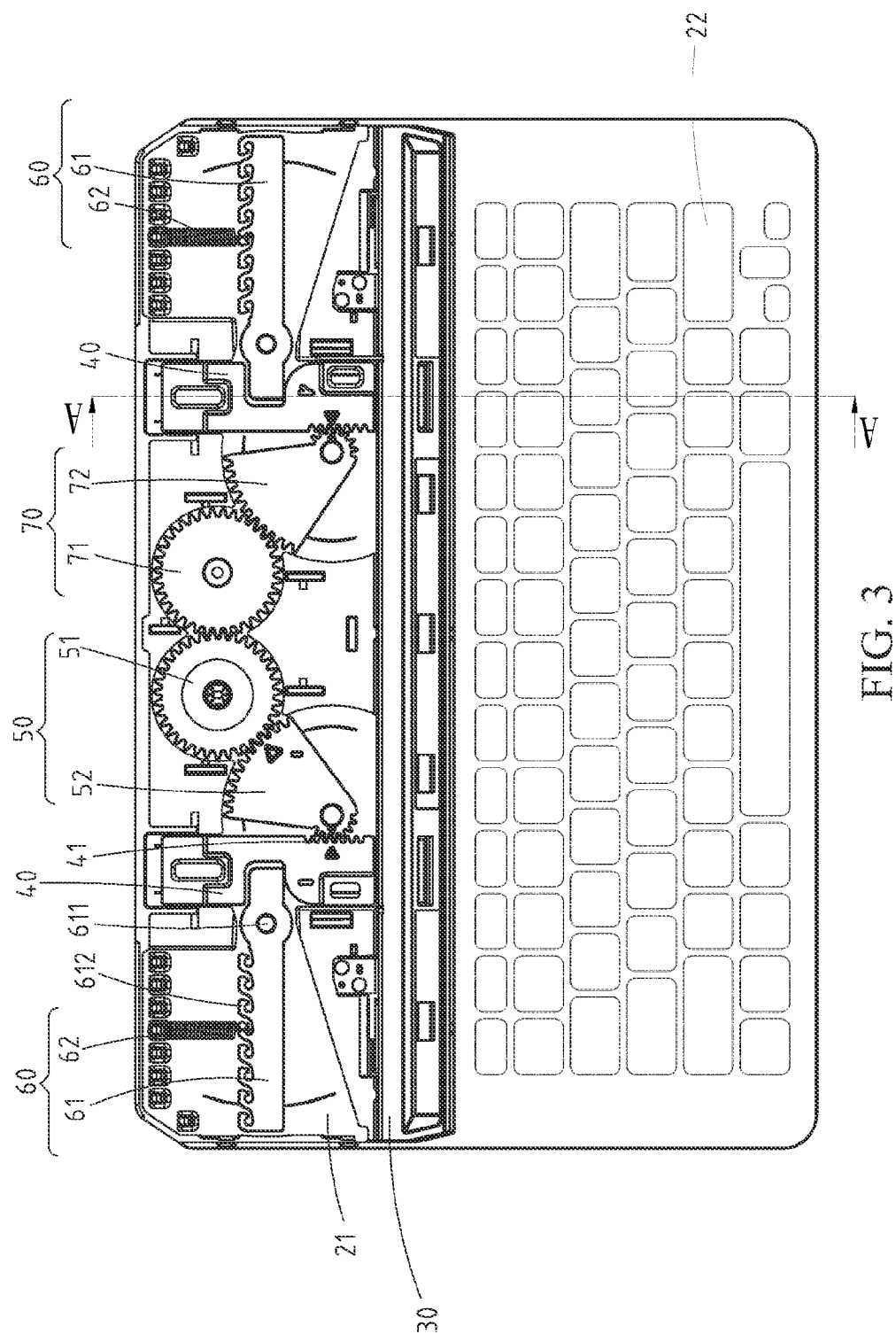
FIG. 3 is a top view of the cover with angle adjustable standing slot of the first embodiment of the disclosure.

Please refer to FIG. 3, which is a top view of the cover with angle adjustable standing slot of the first embodiment of the disclosure. Here, two driven members 40 are assembled in the receiving groove 21 and connected to the cradle 30. In this embodiment, two driven members 40 is applied as an example and provided for disposing a large-size electronic device 10, such as a tablet PC, therefore the two driven members 40 are respectively assembled in the receiving groove 21 for balance; for disposing a small-size electronic device 10, such as a cell phone, one driven member 40 is applied to be assembled in the receiving groove 21.

Similarly, the torque structure 50 is also assembled in the receiving groove 21 and connected to any one of the two driven members 40. The torque structure 50 includes a torque gear 51 and a transmission gear 52. The torque gear 51 engages with the transmission gear 52, and the transmission gear 52 engages with the driven member 40. As shown in FIG. 3, in order to save space and achieve the power transmission, one end of the driven member 40 which is near to the cradle 30 has a plurality of teeth 41; the transmission gear 52 is sectioned, one end thereof is engaged with the teeth 41 of the driven member 40, and another end thereof is engaged with the torque gear 51. Based on this, the linear movement of the driven member 40 is converted into a circular movement for driving the gears to rotate.

In this embodiment, since two driven members 40 are applied, besides the torque structure 50, a gear set 70 is further assembled between the two driven members 40 and provided for transmitting the power from the driven member 40 distant from the torque structure 50 to the torque structure 50 to achieve a force balance. The gear set 70 includes a first gear 71 and a second gear 72. The first gear 71 engages with the torque gear 51 of the torque structure 50, and the second gear 72 engages with the first gear 71 and the driven member 40 distant from the torque structure 50. Similarly, in order to save space and achieve the power transmission, one end of the driven member 40 has a plurality of teeth 41, in which one end of the driven member 40 is near to the cradle 30 and the driven member 40 is distant from the torque structure 50; the second gear 72 is sectioned, one end thereof is engaged with the teeth 41 of the driven member 40 distant form the torque structure 50, and another end thereof is engaged with the first gear 71.

The two elastic structures 60 are assembled in the receiving groove 21 and respectively connected to the two driven members 40. Each elastic structure 60 includes a rotating arm 61 and at least one elastic member 62. The rotating arm 61 is respectively connected to one driven member 40 and at least one elastic member 62. Similarly, for balance, two elastic structures 60 are applied in this embodiment; when the number of the driven member 40 is one, only one elastic structure 60 needs to be assembled in the receiving groove 21. The rotating arm 61 includes a rotating shaft 611 and at least one engaging hook 612. The elastic member 62 can be a spring but not limited thereto. One end of the elastic member 62 is fastened in the receiving groove 21, and another end of the elastic member 62 is assembled with the engaging hook 612 of the rotating arm 61. As shown in FIG. 3, the rotating arm 61 has a number of engaging hooks 612 assembled thereon, so that the number and the position of the elastic members 62 is adjusted based on the required elastic force computed according to the weight of the electronic device 10 and the contact force applied on the electronic device 10. Moreover, although FIG. 3 only shows the elastic structure 60 includes one elastic member 62, the number and the types of the elastic members 62 is adjustable according to user requirements.

Figure 4:
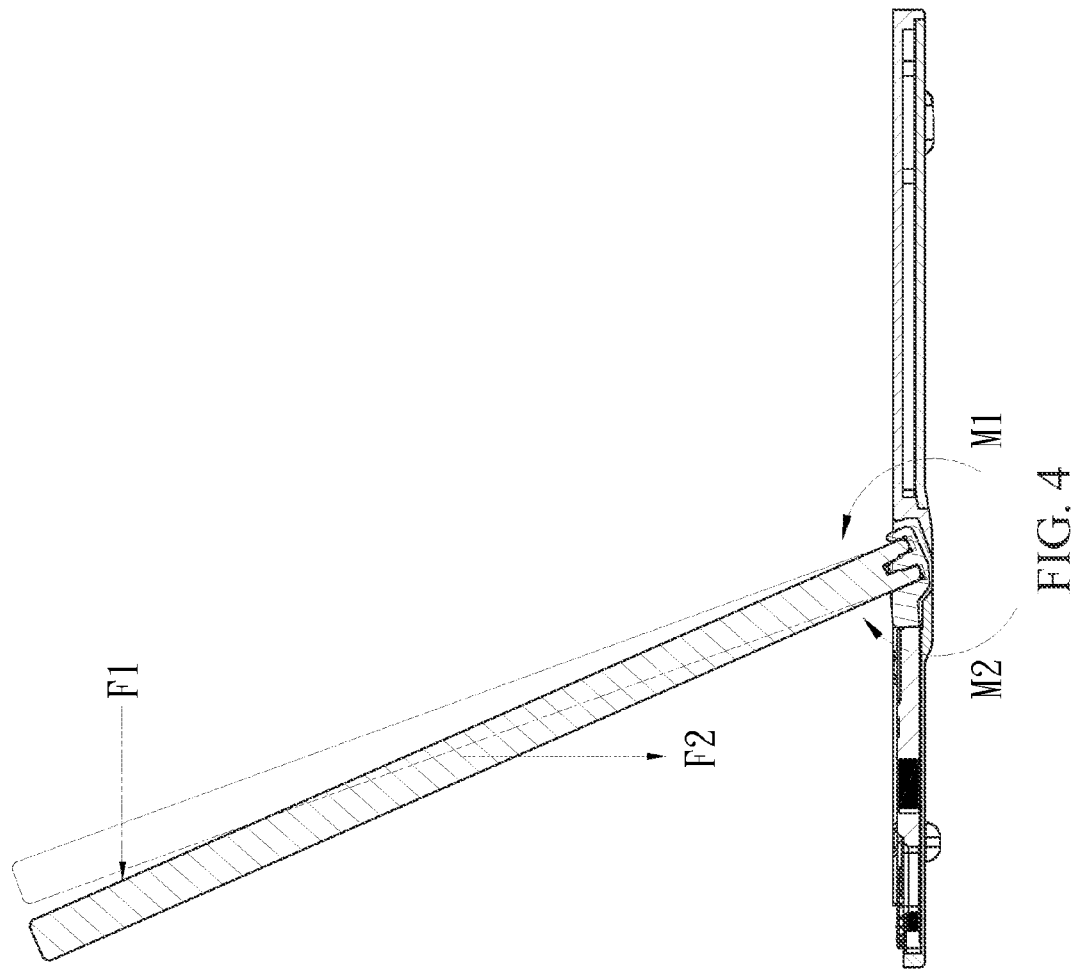
FIG. 4 is a cross-sectional view along line A-A shown in FIG. 3.
Figure 5:
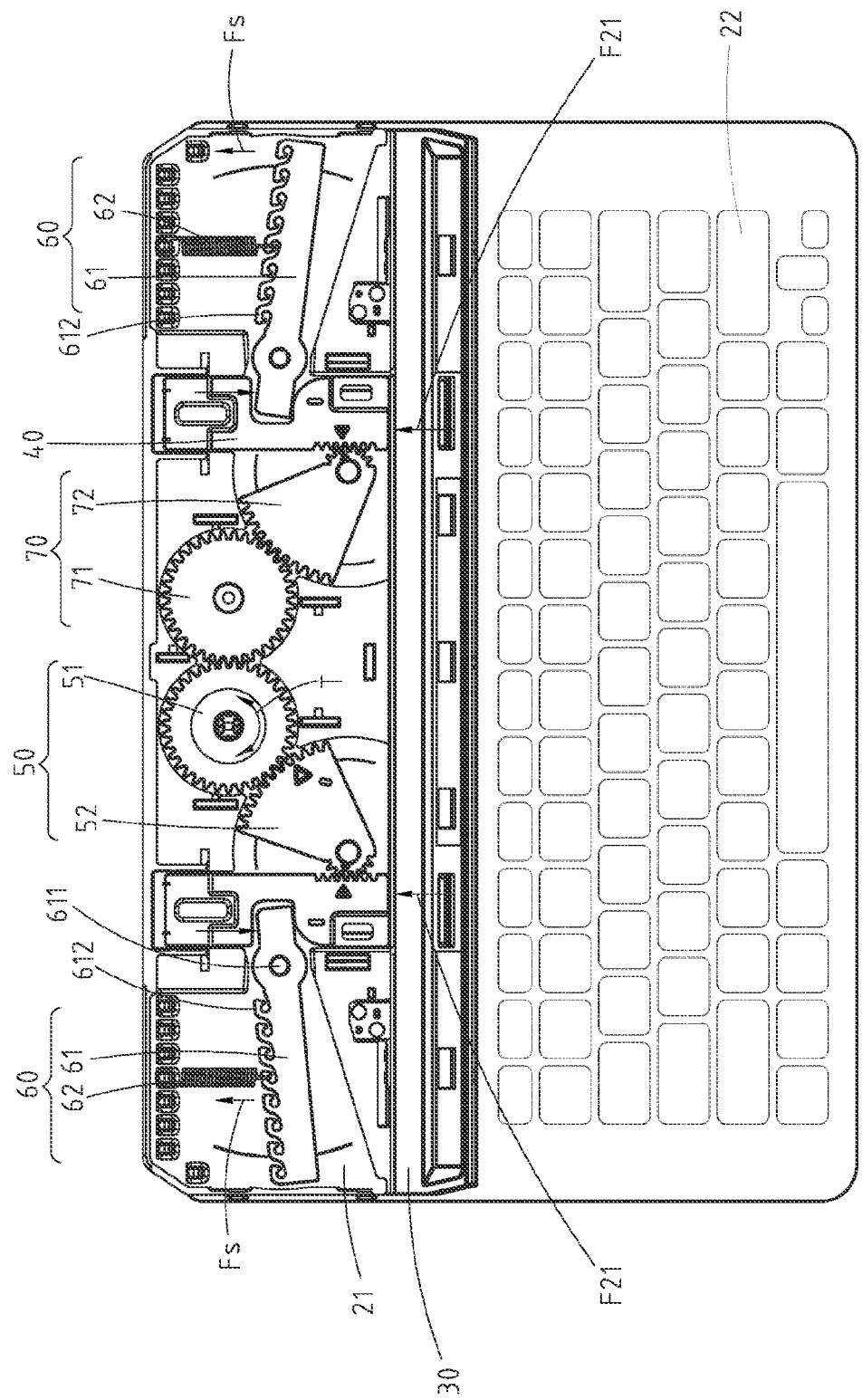
FIG. 5 is a schematic view for showing the applied force of the cover with angle adjustable standing slot.

Next, please refer to FIG. 4 and FIG. 5, which are respectively a cross-sectional view along line A-A shown in FIG. 3 and a schematic view for showing the applied force of the cover with angle adjustable standing slot. When the user wants to adjust the angle between the electronic device 10 and the cover so as to apply a contact force F1 on the electronic device 10 to rotate the electronic device 10 to the adjusted position, the electronic device 10 drives the cradle 30 to rotate using the pivoting shaft 31 as the rotating axis. Meanwhile, the cradle 30 pushes the two driven members 40 to move far from the keyboard 22, and then each driven member 40 instantly drives the transmission gear 52 and the second gear 72 engaged therewith to rotate. Thereafter, the transmission gear 52 drives the torque gear 51 engaged therewith; the second gear 72 drives the first gear 71 engaged therewith, and the first gear 71 drives the torque gear 51. Based on this, the transmission gear 52 and the second gear 72 drive the torque gear 51 to rotate, so that the torque gear 51 generates a torsion T.

Meanwhile, each driven member 40 drives the rotating arm 61 respectively, so that the rotating arm 61 rotates using the rotating shaft 611 as rotating axis so as to pull the elastic member 62 to generate an elastic force Fs. When the user stops forcing on electronic device 10, the gravity F2 of the electronic device 10 generates a moment M1 to the cradle 30; simultaneously, the torsion T of the torque gear 51 and the elastic force Fs of the elastic member 62 resist against the driven member 40, so that the driven member 40 pushes the cradle 30 to generate a moment M2 opposite to the moment M1. When magnitude of the moment M1 equals to that of the moment M2 to achieve a balance condition, the cradle 30 is secured at the adjusted angle, thereby the electronic device 10 in the cradle 30 also being stayed at an appropriate viewing angle.

Based on the above mechanism, the moment generated from the weight of the electronic device 10 and the angle adjustment is converted into a planar force, which is then balanced by the torsional force from the rotating of the torque gear 51 and the elastic force from the stretching of the elastic member 62, so that the angle between the cover and the electronic device 10 is adjustable and stoppable in any angle within an angle interval. Additionally, after the electronic device 10 is rotated and stayed at the adjusted position, the user can simply detach the electronic device 10 from the cradle 30 by pulling the electronic device 10 far from the cradle 30; at this moment, since the moment M1 generated by the electronic device 10 is no longer applied to the cradle 30, the force generated by the elastic member 62 overcomes the opposite force generated by the torque gear 51, thereby the cradle 30 moving resiliently to the initial position.

To be provided for different electronic devices 10, the moments M1 of the electronic devices 10 with different sizes or weights are calculated, and then the number and the position of the torque gears 51 and the elastic members 62 are determined, so that the cover can be provided for different electronic devices 10. For determining the number and the position of the torque gears 51 and the elastic members 62, following three statuses and conditions need to be satisfied.

Status 1: The electronic device 10 does not fall down backwardly when the contact force F1 is applied on the electronic device 10 or when the electronic device 10 is at rest.

Status 2: The electronic device 10 does not rebound forwardly after being adjusted to the adjusted position.

Status 3: The cradle 30 is moved resiliently after the electronic device 10 is detached from the cradle 30.

The conditions of the three statuses are listed as below.

Status 1: the moment M2 generated by the elastic member 62 and the torque gear 51 must be larger than or equal to the gravity F2 of the electronic device 10 and the magnitude of the moment M1 generated by the contact force F1.

Status 2: the magnitude of the summation of the moment generated by the maximum static friction force of the torque gear 51 and the moment generated by the gravity F2 of the electronic device 10 must be larger than or equal to the moment generated by the elastic member 62.

Status 3: the moment generated by the elastic member 62 must be larger than the moment generated by the maximum static friction force of the torque gear 51.

The status 1 and the condition thereof prevents the electronic device 10 from falling down backwardly because of the contact force F1 applied on the electronic device 10 upon the user operates the electronic device 10 by means of touch sensing; namely, when the user operates by means of touch sensing and applies a contact force on the electronic device 10, the electronic device 10 drives the cradle 30 to rotate toward a direction opposite to the keyboard 22, which is inconvenient for operating the electronic device 10 via means of touch sensing. Here, the forces generated from the torque gear 51 and the elastic member 62 are applied to balance the gravity F2 of the electronic device 10 and the contact force F1 applied on the electronic device 10, so that the electronic device 10 will not fall down backwardly upon suffering a lighter force, such as the force for operating the electronic device 10 by means of touching the screen of the electronic device 10.

The status 2 and the condition thereof ensure that after the electronic device 10 is adjusted to a required position, the electronic device 10 will stay at the adjusted position but not rebound to the initial position when force is no more applied to the electronic device 10. As shown in FIG. 5, when the electronic device 10 is adjusted to the adjusted position and the contact force F1 stops applying on the electronic device 10, the force applied on the plane (the plane for placing the cover), is the component force F21 of the gravity F2 of the electronic device 10 on the plane. At this moment, the elastic force Fs generated by the elastic member 62 is provided for resisting against the component force F21; if the elastic force Fs is too large, the elastic member 62 will drive the driven member 40, so that the cradle 30 is pushed to the initial position, thereby resulting in the failure of maintaining the electronic device 10 at the adjusted position. In order to prevent the situation mentioned above, the magnitude of the summation of the moment generated by the maximum static friction force of the torque gear 51 and the moment generated by the gravity F2 of the electronic device 10 must be larger than or equal to the moment generated by the elastic member 62.

The status 3 and the condition thereof ensures that after the electronic device 10 is adjusted to the different adjusted positions, the user can detach the electronic device 10 from the cradle 30 directly and then the cradle 30 is moved resiliently, so that the user does not need to operate the cradle 30 additionally for moving the cradle resiliently; also, the user does not need to move the electronic device 10 to the initial position for detaching the electronic device 10. Please refer again to FIG. 5, in which when the electronic device 10 is detached from the cradle 30, the component force F21 applied on the plane is disappeared and the elastic force Fs of the elastic member 62 and the moment generated by the maximum static friction force of the torque gear 51 are left; in a such situation, for recovering the cradle 30 to the initial position, the moment generated by the elastic member 62 must be larger than the moment generated by the maximum static friction force of the torque gear 51. Consequently, the moment generated by the elastic member 62 drives the driven member 40 and pushes the cradle 30 to move to the initial position resiliently.

Figure 6:
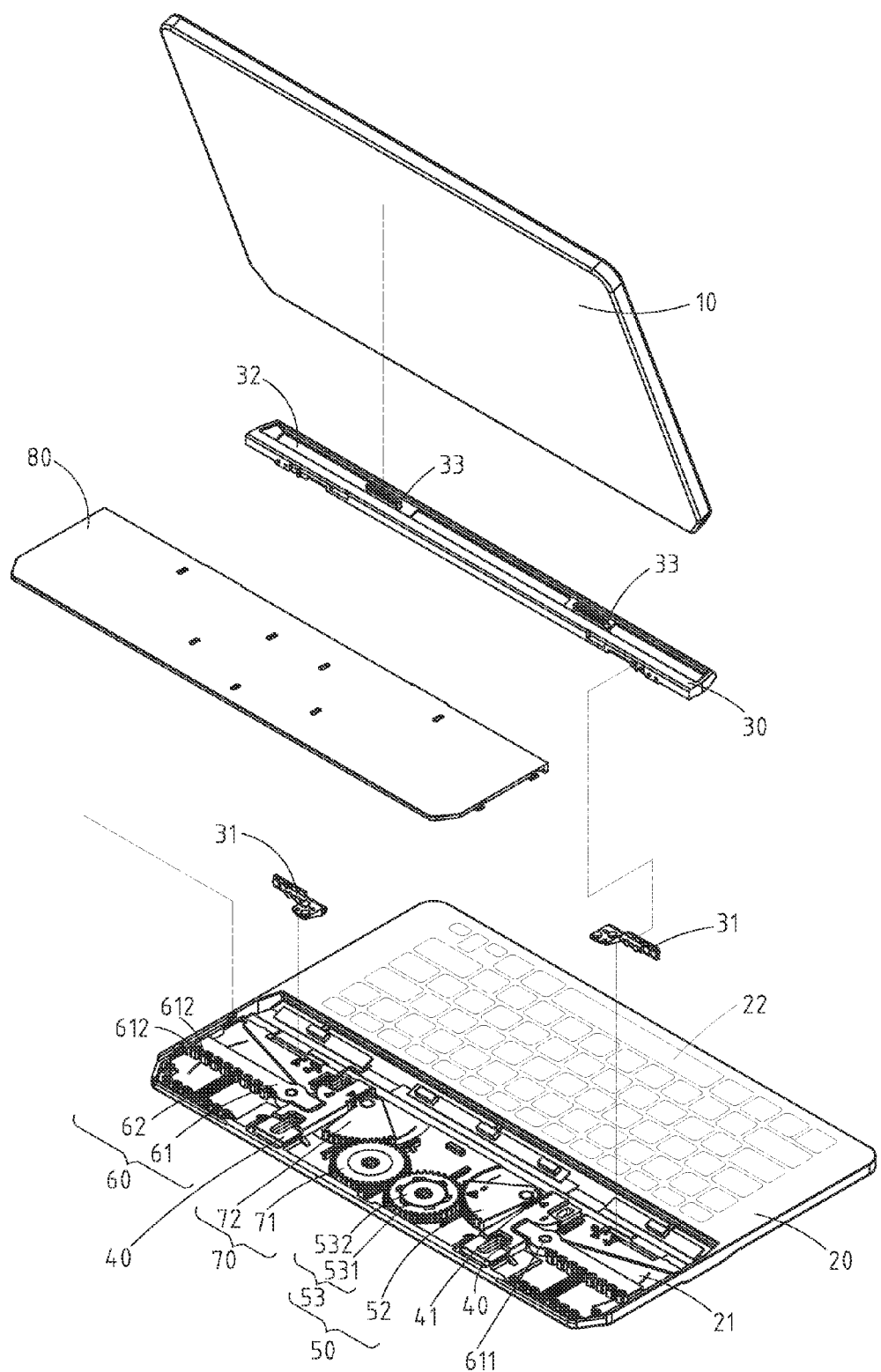
FIG. 6 is an exploded view of a cover with angle adjustable standing slot of a second embodiment of the disclosure.
Figure 7:
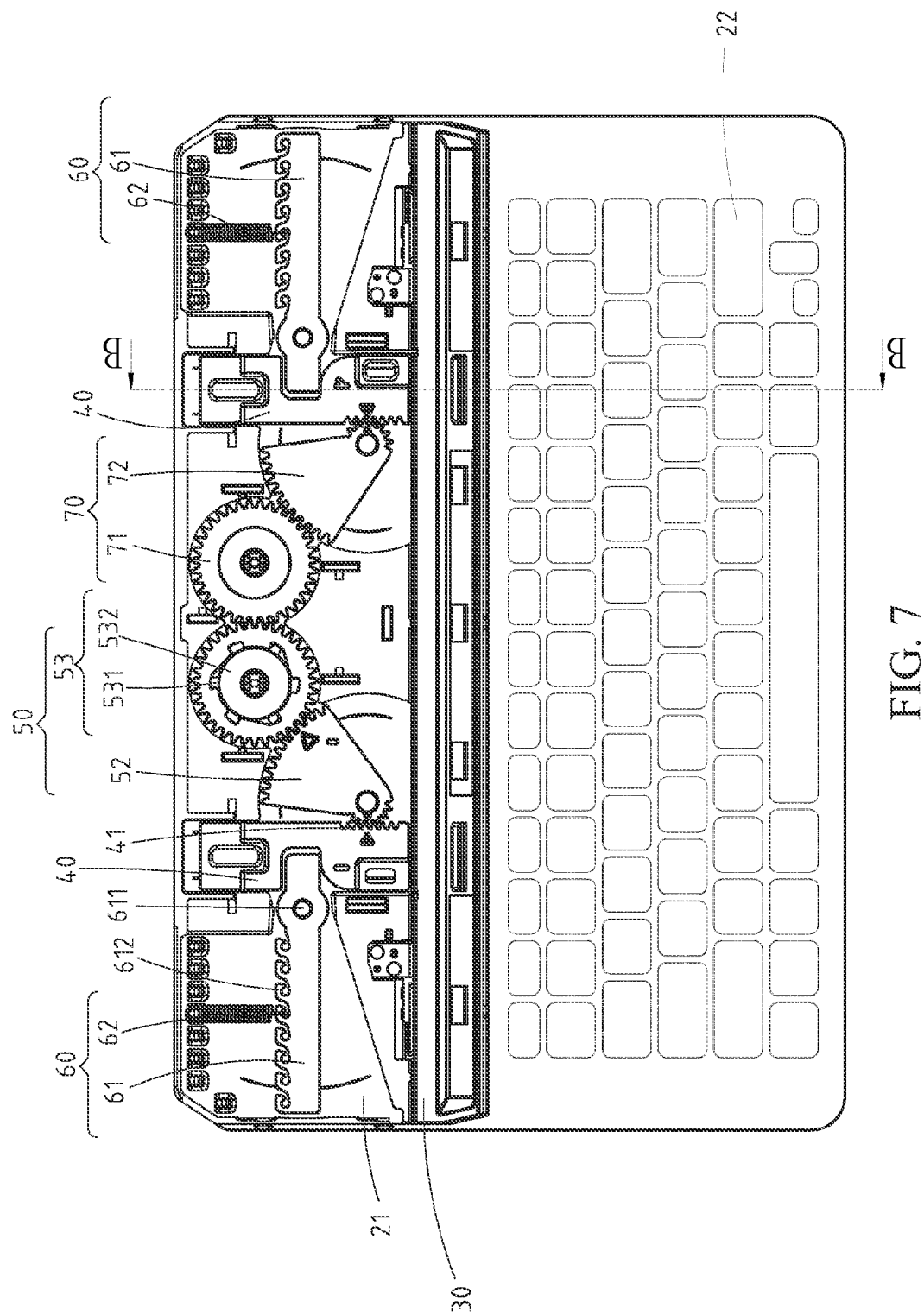
FIG. 7 is a top view of the cover with angle adjustable standing slot of the second embodiment of the disclosure.
Figure 8:
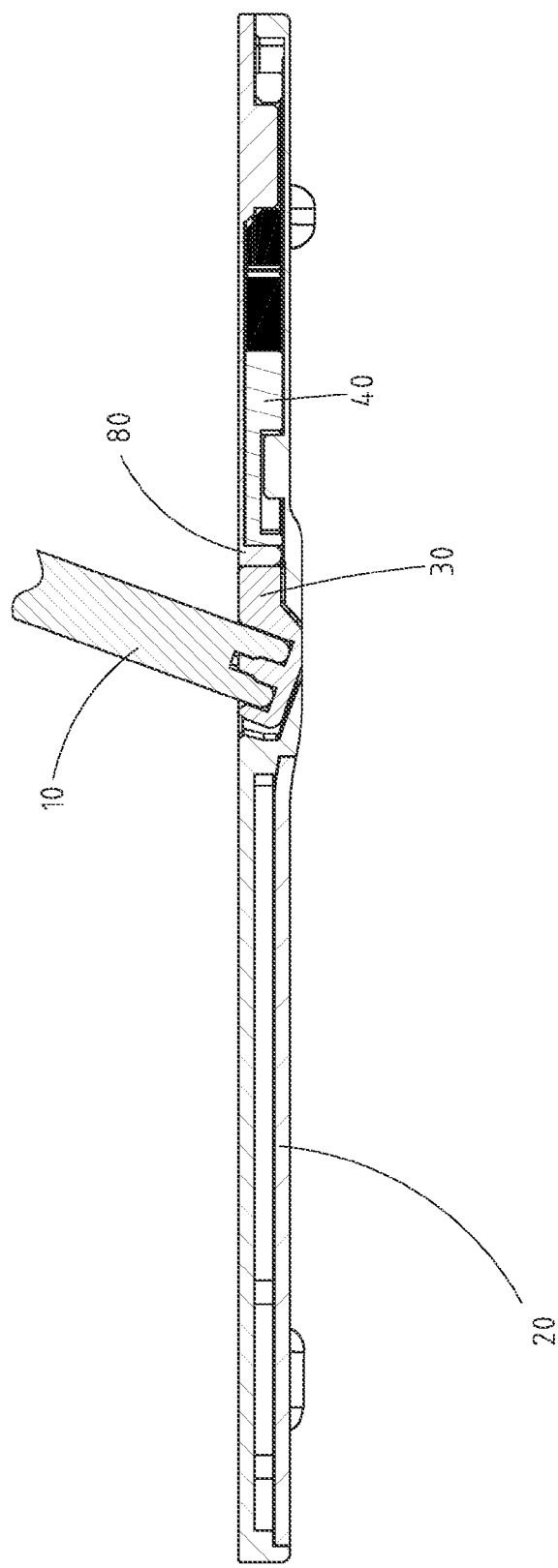
FIG. 8 is a cross-sectional view along line B-B shown in FIG. 7.

Please refer to FIGS. 6-8, FIG. 6 and FIG. 7, which are respectively an exploded view and a top view of a cover with angle adjustable standing slot of a second embodiment of the disclosure, and FIG. 8 is a cross-sectional view along line B-B shown in FIG. 7. The cover with angle adjustable standing slot can be used to place an electronic device 10. The cover includes a base 20, a cradle 30, a lid 80, two driven members 40, a torque structure 50 and two elastic structures 60. In FIG. 7, in order to show the structures inside the cover, the lid 80 is not illustrated.

The structures of the second embodiment are approximately the same as that of the first embodiment, except that in this embodiment, the cover further includes the lid 80 covered on the receiving groove 21 and extended between the cradle 30 and the two driven members 40.

As shown in the cross-sectional view illustrated in FIG. 8, one end of the lid 80 which is near to the cradle 30 is extended downwardly and disposed between the cradle 30 and the two driven members 40. Based on this, the lid 80 is movable along with the movement of the cradle 30 and the two driven members 40 and covers the receiving groove 21 entirely during the movement of the lid 80, so that the appearance of the cover is simple without any inner structures or components being exposed.

Additionally, please refer to FIG. 7, in which embodiment the torque gear is a monodirectional torque gear 53 and includes a ratchet structure 531 and a torque wheel structure 532. That is, when the monodirectional torque gear 53 is rotated along one direction, the ratchet structure 531 drives the torque wheel structure 532 to generate torsional force; while when the monodirectional torque gear 53 is rotated along another direction, the ratchet structure 531 does not drive the torque wheel structure 532 and the torque wheel structure 532 does not generate torsional force. In this embodiment, when the monodirectional torque gear 53 is rotated counterclockwise, the ratchet structure 531 drives the torque wheel structure 532 to generate torsional force; while when the monodirectional torque gear 53 is rotated clockwise, the ratchet structure 531 does not drive the torque wheel structure 532 and the torque wheel structure 532 does not generate torsional force.

Based on this, when the electronic device 10 is detached from the cradle 30, the moment generated by the elastic member 62 makes the elastic member pull the rotating arm without overcoming the moment generated by the maximum static friction force of the monodirectional torque gear 53 and drive the driven member 40 to push the cradle 30 to move resiliently. Accordingly, the selectivity of the number and the position of the elastic member 62, or that of the stretching strength of the elastic member 62 are significantly increased.

Additionally, in this embodiment, the first gear 71 of the gear set 70 is also a torque gear.

Via the two-torque-gear configuration, a larger torsion can be provided, so that even an electronic device 10 with heavier weight can be applied to the cover with angle adjustable standing slot of the disclosure.

In this embodiment, when the electronic device 10 is placed in the cradle 30 with a contact force being applied to the electronic device 10 so as to drive the cradle 30 to rotate from the initial position to the adjusted position, the cradle 30 pushes the lid 80 to drive the two driven members 40. And then, the two driven member 40 simultaneously drive the torque structures 50, the gear set 70 and the two elastic structures 60. At this moment, since the a force balance is formed among the torque structure 50, the gear set 70, the two elastic structures 60 and the electronic device 10, the cradle 30 is secured at the adjusted position when the contact force is removed. Therefore, the angle between the cradle 30 and the electronic device 10 can be adjusted slightly rather than being fixed at a preset angle.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A cover with angle adjustable standing slot, provided for placing an electronic device, comprising:
    a base, having a receiving groove;
    a cradle, rotatably assembled on the base and rotatable between an initial position and an adjusted position;
    at least one driven member, assembled in the receiving groove and connected to the cradle;
    at least one torque structure, assembled in the receiving groove and connected to the at least one driven member; and
    at least one elastic structure, assembled in the receiving groove and connected to the at least one driven member;
    wherein when the electronic device is placed in the cradle with an outer force being applied to the electronic device so as to drive the cradle to rotate from the initial position to the adjusted position, the cradle pushes the at least one driven member to drive the at least one torque structure and the at least one elastic structure simultaneously, so that the cradle is positioned in the adjusted position when the outer force is disappeared.

2. The cover with angle adjusting standing slot according to claim 1, further comprising a lid covered on the receiving groove and extended between the cradle and the at least one driven member.

3. The cover with angle adjusting standing slot according to claim 1, wherein the at least one elastic structure comprises a torque gear and a transmission gear, the torque gear engages with the transmission gear, the transmission gear engages with the at least one driven member.

4. The cover with angle adjustable standing slot according to claim 3, wherein the torque gear is a mono directional torque gear and comprises a ratchet structure and a torque wheel structure.

5. The cover with angle adjustable standing slot according to claim 1, wherein the at least one elastic structure comprises a rotating arm and at least one elastic member, the rotating arm is respectively connected to the at least one driven member and the at least one elastic member.

6. The cover with angle adjustable standing slot according to claim 1, further comprising another driven member, a gear set and another elastic structure assembled in the receiving groove, the gear set and another elastic structure are connected to another driven member.

7. The cover with angle adjustable standing slot according to claim 6, wherein the gear set comprises a first gear and a second gear, the first gear engages with the at least one torque structure, the second gear engages with the first gear and another driven member.

8. The cover with angle adjustable standing slot according to claim 7, wherein the first gear is another torque gear.

9. The cover with angle adjustable standing slot according to claim 6, wherein another elastic structure comprises a rotating arm and at least one elastic member, the rotating arm is respectively connected to another driven member and the at least one elastic member.

10. The cover with angle adjustable standing slot according to claim 1, further comprising a keyboard assembled on the base.

\* \* \* \* \*